(12) United States Patent
Cho

(10) Patent No.: US 10,524,329 B2
(45) Date of Patent: Dec. 31, 2019

(54) APPARATUS FOR GENERATING PWM SIGNAL AND APPARATUS FOR CONTROLLING LIGHT HAVING THE SAME

(71) Applicant: FEELUX CO., LTD., Gyeonggi-do (KR)

(72) Inventor: Kyu Won Cho, Gyeonggi-do (KR)

(73) Assignee: FEELUX CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/464,853

(22) PCT Filed: Dec. 22, 2017

(86) PCT No.: PCT/KR2017/015417
§ 371 (c)(1),
(2) Date: May 29, 2019

(87) PCT Pub. No.: WO2018/124670
PCT Pub. Date: Jul. 5, 2018

(65) Prior Publication Data
US 2019/0350064 A1 Nov. 14, 2019

(30) Foreign Application Priority Data
Dec. 26, 2016 (KR) ......................... 10-2016-0179133

(51) Int. Cl.
*H05B 33/00* (2006.01)
*H05B 37/02* (2006.01)
*H03K 4/08* (2006.01)
*H03K 7/08* (2006.01)

(52) U.S. Cl.
CPC ........... *H05B 37/0209* (2013.01); *H03K 4/08* (2013.01); *H03K 7/08* (2013.01)

(58) Field of Classification Search
CPC ...... H04B 2203/5412; H04B 2203/542; H04B 2203/5441; H04B 3/54; H05B 41/2885; H05B 41/42; H03D 13/004; G06F 3/0412
See application file for complete search history.

(56) References Cited

FOREIGN PATENT DOCUMENTS

| KR | 10-2000-0074854 A | 12/2000 |
|----|-------------------|---------|
| KR | 10-2011-0068614 A | 6/2011  |
| KR | 10-2013-0080293 A | 7/2013  |

(Continued)

OTHER PUBLICATIONS

International Search Report for PCT/KR2017/015417 dated Apr. 26, 2018.

(Continued)

*Primary Examiner* — Monica C King
(74) *Attorney, Agent, or Firm* — The PL Law Group, PLLC

(57) ABSTRACT

A pulse width modulation (PWM) signal generator according to one embodiment of the present invention includes a first comparison unit for comparing a duty value being inputted with a reference wave being inputted to output a first PWM signal, a signal inversion unit for inverting the duty value being inputted on the basis of a maximum value of the reference wave, a second comparison unit for comparing the duty value inverted by the signal inversion unit with the reference wave being inputted to output a second PWM signal, and a reference wave generator for generating a reference wave to transmit the same to each of the first comparison unit and the second comparison unit.

8 Claims, 6 Drawing Sheets

(56) References Cited

FOREIGN PATENT DOCUMENTS

KR       10-1353254 B1    1/2014
KR   10-2015-0034015 A    4/2015

OTHER PUBLICATIONS

Office action dated Sep. 21, 2017 from Korean Patent Office in a counterpart Korean Patent Application No. 10-2016-0179133 (all the cited references are listed in this IDS.) (English translation is submitted herewith.).

APPARATUS FOR GENERATING PWM SIGNAL AND APPARATUS FOR CONTROLLING LIGHT HAVING THE SAME

CROSS REFERENCE TO RELATED APPLICATIONS AND CLAIM OF PRIORITY

This application claims benefit under 35 U.S.C. 119(e), 120, 121, or 365(c), and is a National Stage entry from International Application No. PCT/KR2017/015417, filed on Dec. 22, 2017, which claims priority to the benefit of Korean Patent Application No. 10-2016-0179133 filed in the Korean Intellectual Property Office on Dec. 26, 2016, the entire contents of which are incorporated herein by reference.

TECHNICAL FIELD

Embodiments of the present invention relate to lighting control technology.

BACKGROUND ART

Generally, lighting is controlled using pulse width modulation (PWM) signals. When two or more lights are controlled, a PWM signal is generated for each light, and a power supply device supplies power to each light according to the PWM signal. However, according to conventional lighting control technique, an overlapping section between PWM signals causes a difference between the maximum supply power and the minimum supply power to increase in a power supply device. Thus, the life of components of the power supply device may be shortened, and noise may be generated.

SUMMARY

An embodiment of the present invention is to provide a pulse width modulation (PWM) signal generator which is capable of preventing the life of components of a power supply unit from being shortened and capable of reducing noise.

According to an aspect of the present invention, there is a pulse width modulation (PWM) signal generator including a first comparison unit configured to compare an input duty value to an input reference wave and output a first PWM signal; a signal inversion unit configured to invert the input duty value on the basis of a maximum value of the reference wave; a second comparison unit configured to compare the duty value inverted by the signal inversion unit to the input reference wave and output a second PWM signal; and a reference wave generator configured to generate the reference wave and transfer the reference wave to the first comparison unit and the second comparison unit.

The signal inversion unit may subtract the input duty value from the maximum value of the reference wave in order to invert the input duty value.

The reference wave may be a sawtooth wave or a triangle wave, and the first comparison unit may output a high signal while the reference wave has a value less than or equal to the input duty value and output a low signal while the reference wave has a value exceeding the input duty value, thereby generating the first PWM signal.

The reference wave may be a sawtooth wave or a triangle wave, and the second comparison unit may output a low signal while the reference wave has a value less than or equal to the inverted duty value and output a high signal while the reference wave has a value exceeding the inverted duty value, thereby generating the second PWM signal.

According to another aspect of the present invention, there is a PWM signal generator including a first comparison unit configured to compare an input first duty value to an input reference wave and output a first PWM signal; a signal inversion unit configured to invert a second duty value different from the first duty value on the basis of a maximum value of the reference wave; a second comparison unit configured to compare the second duty value inverted by the signal inversion unit to the input reference wave and output a second PWM signal; and a reference wave generator configured to generate the reference wave and transfer the reference wave to the first comparison unit and the second comparison unit.

The signal inversion unit may subtract the second duty value from the maximum value of the reference wave in order to invert the second duty value.

The reference wave may be a sawtooth wave or a triangle wave, and the first comparison unit may output a high signal while the reference wave has a value less than or equal to the input first duty value and output a low signal while the reference wave has a value exceeding the input first duty value, thereby generating the first PWM signal.

The reference wave may be a sawtooth wave or a triangle wave, and the second comparison unit may output a low signal while the reference wave has a value less than or equal to the inverted second duty value and output a high signal while the reference wave has a value exceeding the inverted second duty value, thereby generating the second PWM signal.

According to an embodiment of the present invention, by reducing a difference between the maximum power and the minimum power of the power supply unit, it is possible to extend the life of components of the power supply unit and also to reduce generation of noise and electromagnetic waves.

DETAILED DESCRIPTION

Hereinafter, embodiments of the present invention will be described in detail with reference to the accompanying drawings. The following detailed description is provided for better understanding of a method, an apparatus, and/or a system that are disclosed in this specification. However, this is merely exemplary, and the present invention is not limited thereto.

In describing embodiments of the present invention, when it is determined that a detailed description of known techniques associated with the present invention would unnecessarily obscure the subject matter of the present invention, to the detailed description thereof will be omitted. Also, terms used herein are defined in consideration of the functions of the present invention and may be changed depending on a user, the intent of an operator, or a custom. Accordingly, the terms should be defined based on the following overall description of this specification. The terminology used herein is for the purpose of describing particular embodiments only and is not intended to be limiting of example embodiments of the invention. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

In the following description, the terms "transfer," "communication," "transmission," "reception," or the like indicate that a signal or information is conveyed from one element to another element directly or through intervening elements. In particular, when a signal or information is referred to as being "transferred" or "transmitted" to one element, the element indicates a final destination rather than a direct destination. This may also be applied to a case in which the signal or information is "received." In the present specification, when two or more pieces of data or information are referred to as being "associated" with one another, this indicates that, if a piece of data (or information) is acquired, at least other pieces of data (or information) may be acquired based on the association It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention.

Figure 1:
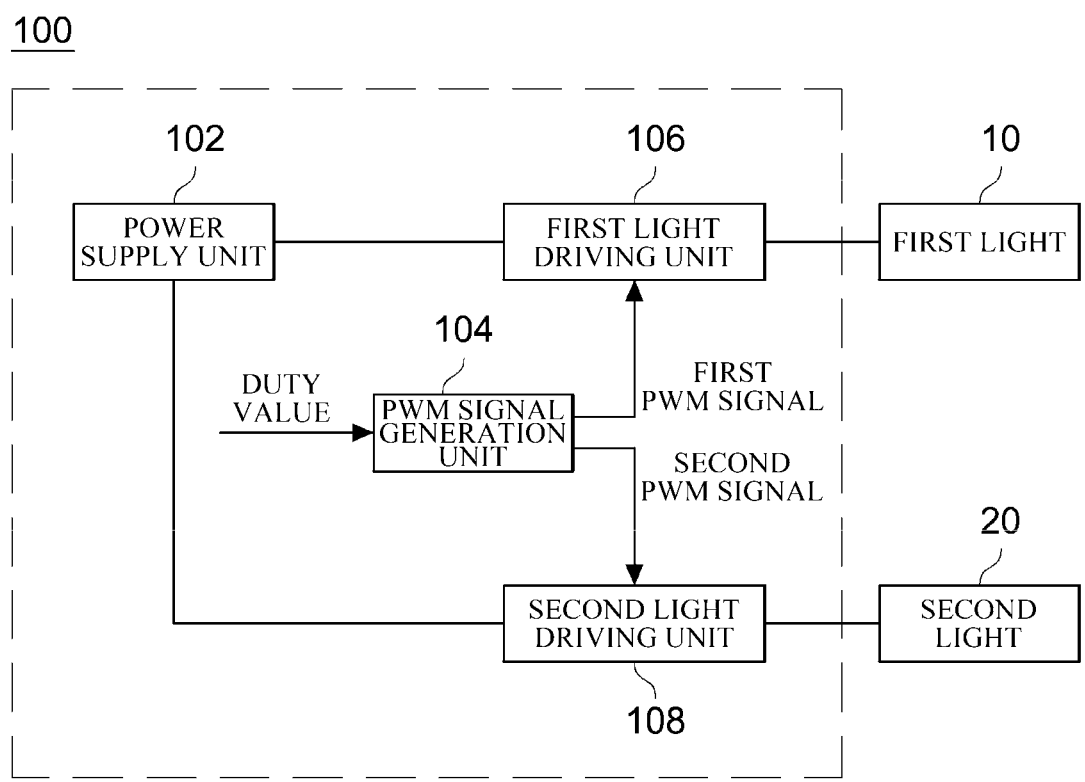
FIG. 1 is a block diagram showing a configuration of a lighting control apparatus according to an embodiment of the present invention.

FIG. 1 is a block diagram showing a configuration of a lighting control to apparatus according to an embodiment of the present invention.

Referring to FIG. 1, a lighting control apparatus 100 may include a power supply unit 102, a pulse width modulation (PWM) signal generation unit 104, a first light driving unit 106, and a second light driving unit 108. Here, the control of two lights 10 and 20 will be described as an embodiment. However, the present invention is not limited thereto, and it will be appreciated that the present invention is applicable in controlling various other lights.

The power supply unit 102 serves to supply power to a first light 10 and a second light 20. An alternating current (AC) power source (e.g., a commercial power source) or a direct current (DC) power source (e.g., a battery or the like) may be used as the power supply unit 102. The power supply unit 102 may include a conversion unit (not shown) for converting AC power into DC power or for converting DC power into AC power as necessary.

The PWM signal generation unit 104 may generate the first PWM signal and the second PWM signal on the basis of an input duty value. The PWM signal generation unit 104 may transfer the first PWM signal to a first light driving unit 106 and transfer the second PWM signal to a second light driving unit 108. Through the first PWM signal and the second PWM signal, it is possible to perform dimming control on the first light 10 and the second light 20. The structure and operation of the PWM signal generation unit 104 will be described in detail below.

The first light driving unit 106 may supply the power of the power supply unit 102 to the first light 10 according to the first PWM signal. In detail, the first light driving unit 106 may supply or cut off the power of the power supply unit 102 to the first light 10 according to the first PWM signal. The first PWM signal includes a high signal and a low signal, and the first light driving unit 106 may supply power to the first light 10 while the first PWM signal is the high signal and may cut off power to the first light 10 while the first PWM signal is the low signal. The first light driving unit 106 may include a switching device that is switched on or off according to the first PWM signal.

The second light driving unit 108 may supply the power of the power supply unit 102 to the second light 20 according to the second PWM signal. In detail, the second light driving unit 108 may supply or cut off the power of the power supply unit 102 to the second light 20 according to the second PWM signal. The second PWM signal includes a high signal and a low signal, and the second light driving unit 108 may supply power to the second light 20 while the second PWM signal is the high signal and may cut off power to the second light 20 while the second PWM signal is the low signal. The second light driving unit 108 may include a switching device that is switched on or off according to the second PWM signal.

Figure 2:
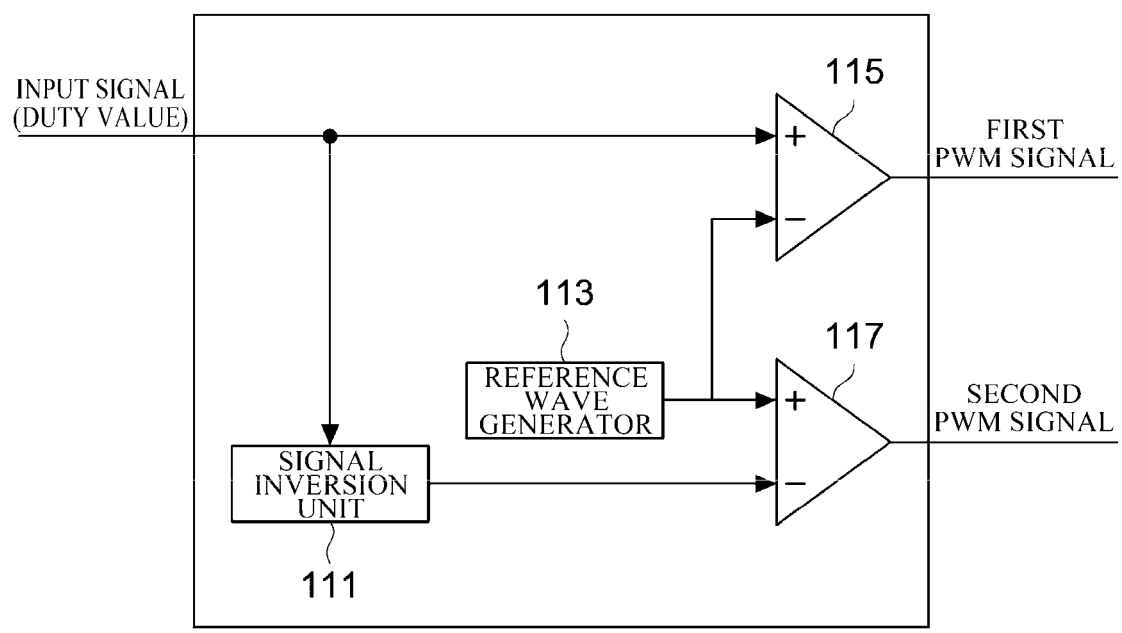
FIG. 2 is a diagram showing a configuration of a pulse width modulation (PWM) signal generation unit according to an embodiment of the present invention.

FIG. 2 is a diagram showing a configuration of the PWM signal generation unit 104 according to an embodiment of the present invention.

Referring to FIG. 2, the PWM signal generation unit 104 may include a signal inversion unit 111, a reference wave generator 113, a first comparison unit 115, and a second comparison unit 117.

Here, an input signal (i.e., a duty value) may be input to a first terminal (e.g., positive (+) terminal) of the first comparison unit 115. The duty value may range from 0 to 1 when the maximum value of the reference wave is set to 1. A reference wave generated by the reference wave generator 113 may be input to a second terminal (e.g., negative (−) terminal) of the first comparison unit 115. Also, a reference wave generated by the reference wave generator 113 may be input to a first terminal (e.g., positive (+) terminal) of the second comparison unit 117. Also, the duty value inverted by the signal inversion unit 111 may be input to the second terminal (e.g., negative (−) terminal) of the second comparison unit 117.

The signal inversion unit 111 serves to invert an input duty value. In detail, the signal inversion unit 111 may subtract the input duty value from the maximum value of the reference wave to invert the duty value. The duty value inverted by the signal inversion unit 111 may be input to the second terminal of the second comparison unit 117.

The reference wave generator 113 may generate a reference wave in a predetermined period. Here, the reference wave is a wave which is a reference for generating a PWM signal, for example, a triangle wave or a sawtooth wave. A method of generating triangle waves or sawtooth waves is a well-known technique, and thus a detailed description thereof will be omitted. Reference waves generated by the reference wave generator 113 may be input to the second terminal of the first comparison unit 115 and the first terminal of the to second comparison unit 117.

The first comparison unit 115 may compare an input duty value to the reference wave and output a first PWM signal. In detail, the first comparison unit 115 may output a high signal while the value of the reference wave input from the reference wave generator 113 is less than or equal to the input duty value. Also, the first comparison unit 115 may output a low signal while the value of the reference wave input from the reference wave generator 113 exceeds the input duty value.

The second comparison unit 117 may compare a duty value inverted by the signal inversion unit 111 to the reference wave and output a second PWM signal. In detail, the second comparison unit 117 may output a low signal while the value of the reference wave input from the reference wave generator 113 is less than or equal to the inverted duty value. Also, the second comparison unit 117 may output a high signal while the value of the reference wave input from the reference wave generator 113 exceeds the duty value.

Figure 3:
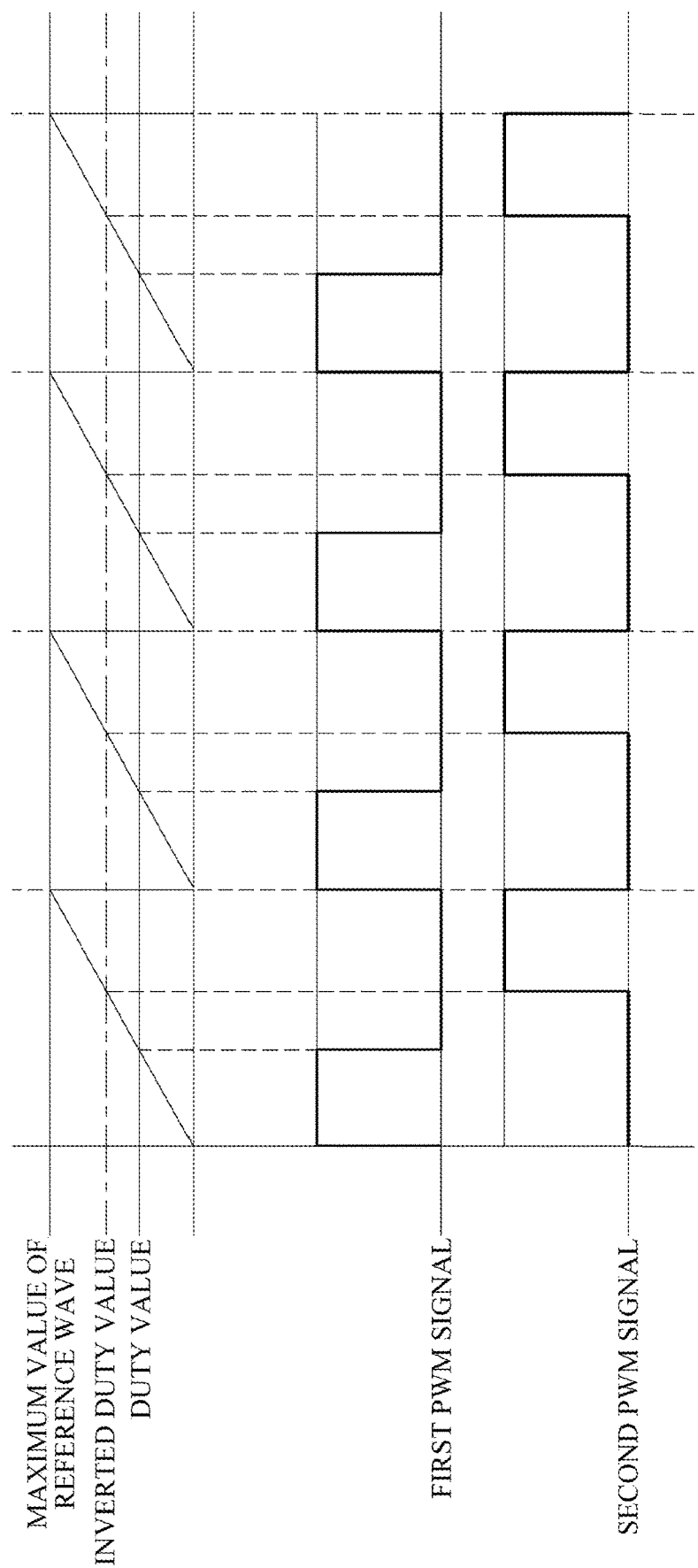
FIG. 3 is a diagram showing that a first PWM signal and a second PWM signal are output by a PWM signal generation unit according to an embodiment of the present invention.

FIG. 3 is a diagram showing that a first PWM signal and a second PWM signal are output by the PWM signal generation unit 104 according to an embodiment of the present invention. Here, it is assumed that the reference wave is a sawtooth wave.

Referring to FIG. 3, the first comparison unit 115 may output a high signal while the value of the reference wave input from the reference wave generator 113 is less than or equal to the input duty value and output a low signal while the value of the reference wave input from the reference wave generator 113 exceeds the input duty value, thereby generating a first PWM signal.

Also, the second comparison unit 117 may output a low signal while the value of the reference wave input from the reference wave generator 113 is less than or equal to the inverted duty value and output a high signal while the value of the reference wave input from the reference wave generator 113 exceeds the inverted duty value, thereby generating a second PWM signal.

Figure 4:
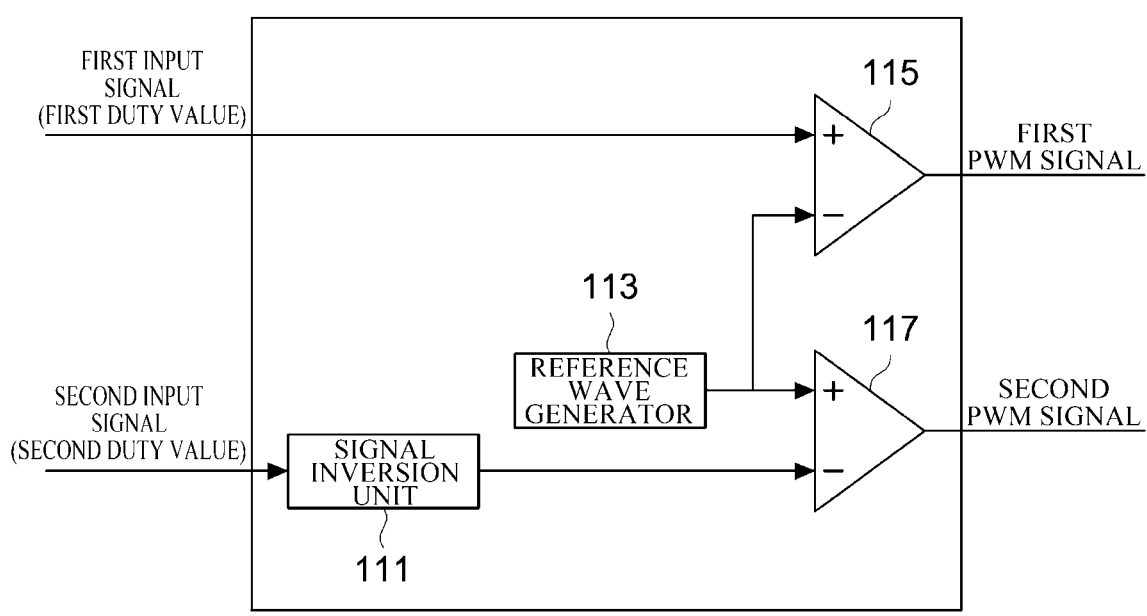
FIG. 4 is a diagram showing a configuration of a PWM signal generation unit according to another embodiment of the present invention.

FIG. 4 is a diagram showing a configuration of the PWM signal generation unit 104 according to another embodiment of the present invention.

Referring to FIG. 4, the PWM signal generation unit 104 may include a signal inversion unit 111, a reference wave generator 113, a first comparison unit 115, and a second comparison unit 117.

Here, a first input signal (i.e., a first duty value) may be input to a first terminal of the first comparison unit 115. A reference wave generated by the reference wave generator 113 may be input to a second terminal of the first comparison unit 115. Also, a reference wave generated by the reference wave generator 113 may be input to a first terminal of the second comparison unit 117.

Meanwhile, a second input signal (i.e., a second duty value) may be input to the signal inversion unit 111. The second duty value may be different from the first duty value. The signal inversion unit 111 may invert the input second duty value. In detail, the signal inversion unit 111 may subtract the input second duty value from the maximum value of the reference wave to invert the second duty value.

The second duty value inverted by the signal inversion unit 111 may be input to a second terminal of the second comparison unit 117.

The first comparison unit 115 may compare the input first duty value to the reference wave and output a first PWM signal. In detail, the first comparison unit 115 may output a high signal while the value of the reference wave input from the reference wave generator 113 is less than or equal to the input first duty value. Also, the first comparison unit 115 may output a low signal while the value of the reference wave input from the reference wave generator 113 exceeds the input first duty value.

The second comparison unit 117 may compare a second duty value inverted by the signal inversion unit 111 to the reference wave and output a second PWM signal. In detail, the second comparison unit 117 may output a low signal while the value of the reference wave input from the reference wave generator 113 is less than or equal to the inverted second duty value. Also, the second comparison unit 117 may output a high signal while the value of the reference wave input from the reference wave generator 113 exceeds the second duty value.

Figure 5:
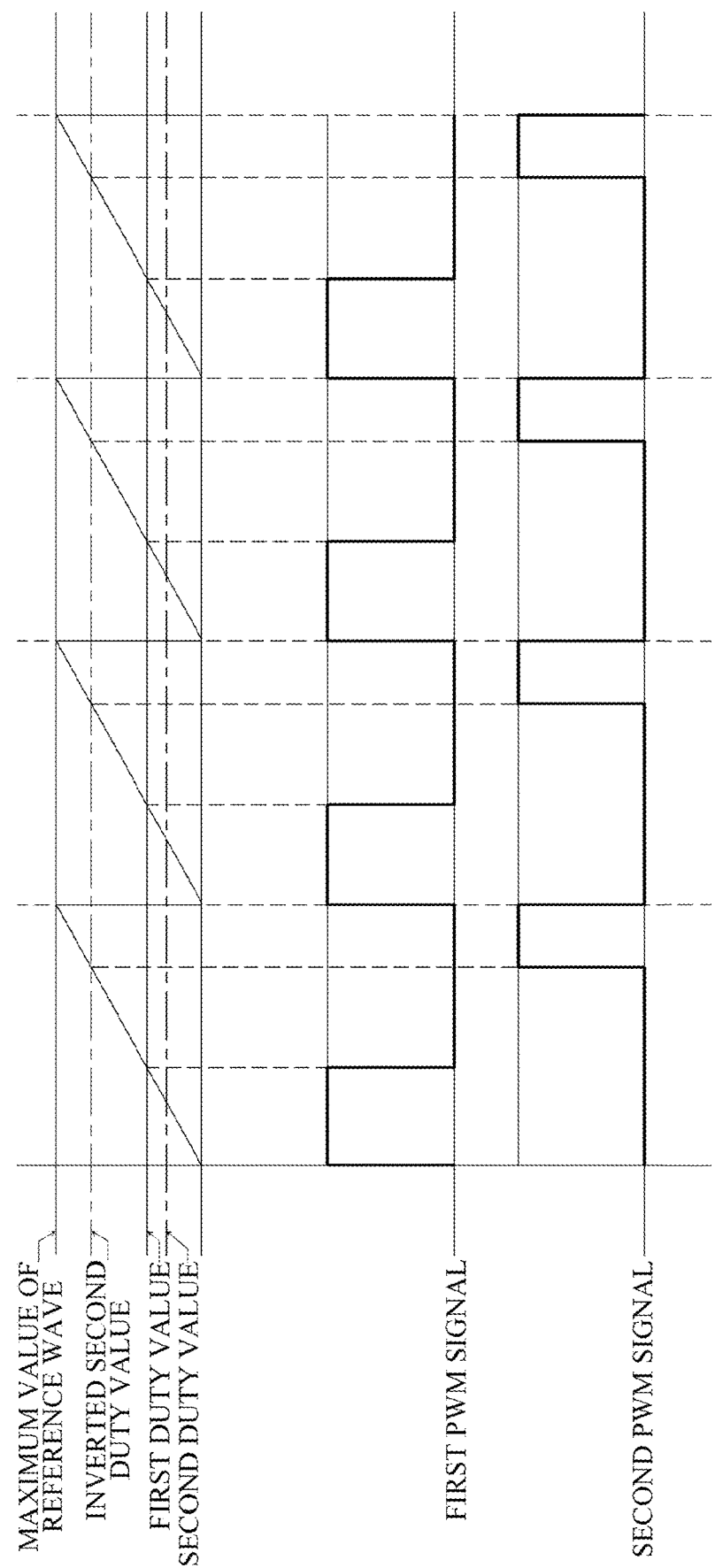
FIG. 5 is a diagram showing that a first PWM signal and a second PWM signal are output by a PWM signal generation unit according to another embodiment of the present invention.

FIG. 5 is a diagram showing that a first PWM signal and a second PWM signal are output by the PWM signal generation unit 104 according to another embodiment of the present invention. Here, it is assumed that the reference wave is a sawtooth wave.

Referring to FIG. 5, the first comparison unit 115 may output a high signal while the value of the reference wave input from the reference wave generator 113 is less than or equal to the input first duty value and output a low signal while the value of the reference wave input from the reference wave generator 113 exceeds the input first duty value, thereby generating a first PWM signal.

Also, the second comparison unit 117 may output a low signal while the value of the reference wave input from the reference wave generator 113 is less than or equal to the inverted second duty value and output a high signal while the value of the reference wave input from the reference wave generator 113 exceeds the inverted second duty value, thereby generating a second PWM signal.

Figure 6:
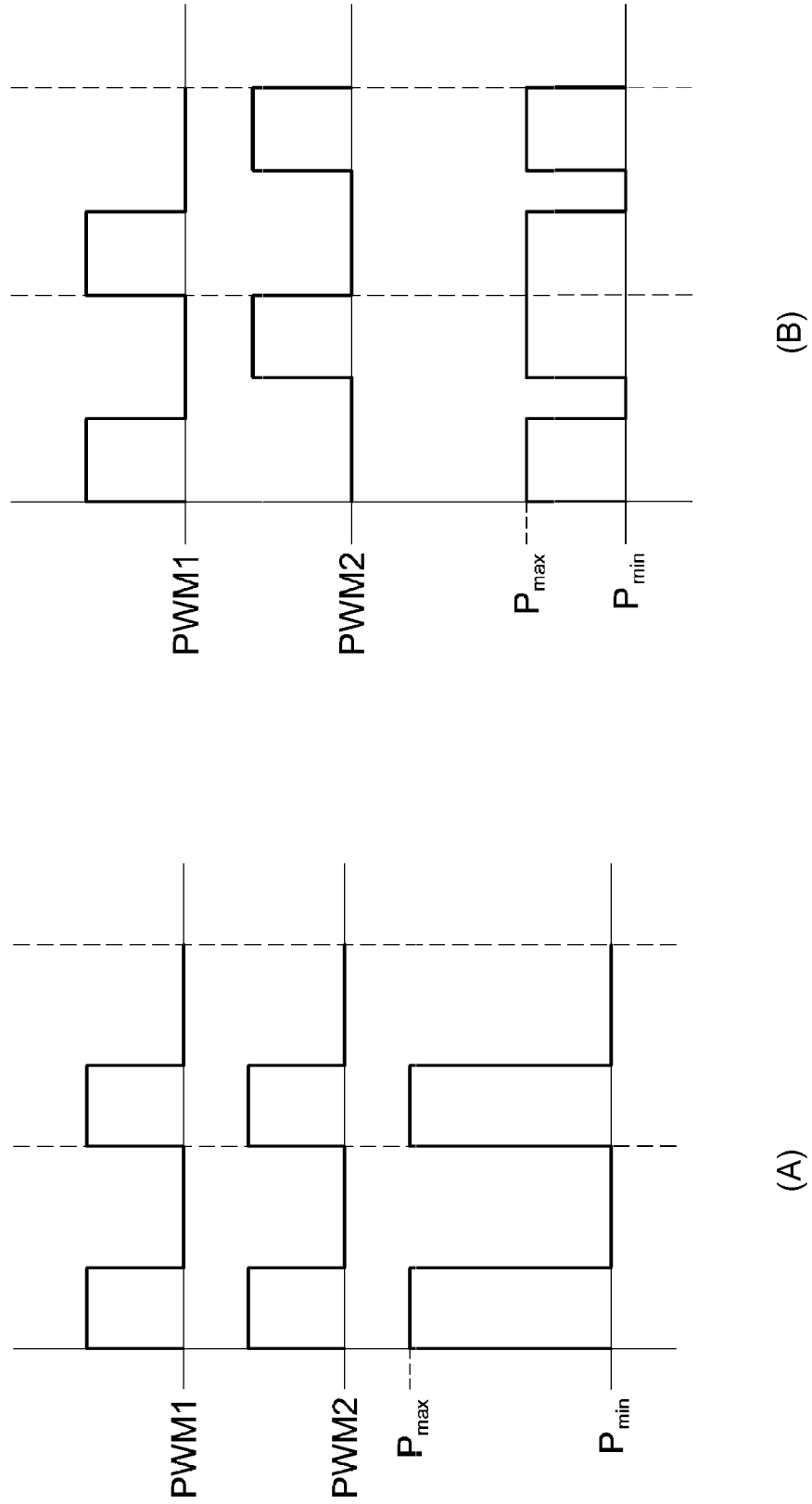
FIG. 6 is a diagram showing comparison of power consumption between a case where a PWM signal is generated according to the related art ((A) of FIG. 6) and a case where a PWM signal is generated by a PWM signal generation unit according to an embodiment of the present invention ((B) of FIG. 6).

FIG. 6 is a diagram showing comparison of power consumption between a case where a PWM signal is generated according to the related art ((A) of FIG. 6) and a case where a PWM signal is generated by the PWM signal generation unit 104 according to an embodiment of the present invention ((B) of FIG. 6). Here, a first PWM signal PWM1 and a second PWM signal PWM2 output by the PWM signal generation unit 104, which are shown in FIG. 3, will be described as an example.

Referring to (A) of FIG. 6, conventionally, the maximum power Pmax used in a power supply unit is two times power corresponding to the high signal of the first PWM signal PWM1 and the second PWM signal PWM2, and the minimum power Pmin used in the power supply unit is power corresponding to the low signal of the first PWM signal PWM1 and the second PWM signal PWM2. Here, when the power corresponding to the low signal of the first PWM signal PWM1 and the second PWM signal PWM2 is 0, the difference between the maximum power Pmax and the minimum power Pmin is two times power corresponding to the high signal of the first PWM signal PWM1 and the second PWM signal PWM2. As described above, a large difference between the maximum power Pmax and the minimum power Pmin in the power supply unit shortens the life of components (e.g., capacitors) of the power supply unit and causes noise.

Referring to (B) of FIG. 6, the maximum power Pmax of the power supply unit 102 according to an embodiment of the present invention is power corresponding to the high signal of the first PWM signal PWM1 and the second PWM signal PWM2, and the minimum power Pmin of the power supply unit 102 is power corresponding to the low signal of the first PWM signal PWM1 and the second PWM signal PWM2. Here, when the power corresponding to the low signal of the first PWM signal PWM1 and the second PWM signal PWM2 is 0, the difference between the maximum power Pmax and the minimum power Pmin of the power supply unit 102 is equal to power corresponding to the high signal of the first PWM signal PWM1 and the second PWM signal PWM2. Thus, the difference between the maximum power Pmax and the minimum power Pmin is reduced to half compared to the related art.

Accordingly, according to the present invention, by reducing the difference between the maximum power and the minimum power of the power supply unit 102, it is possible to extend the life of components of the power supply unit 102 by preventing a reduction in the life of the components and also to reduce generation of noise and electromagnetic waves.

The PWM signal generation unit 104 has been described as generating the first PWM signal and the second PWM signal for controlling the two lights 10 and 20, but the present invention is not limited thereto. The PWM signal may be generated in the same or a similar way even when various numbers (i.e., three or more) of lights are controlled. For example, when three lights are controlled, the PWM signal generation unit 104 may generate a first PWM signal and a second PWM signal for two lights in the above-described manner and also generate a third PWM signal, which is obtained by performing phase delay such that the third PWM signal does not overlap with the first PWM signal and the second PWM signal, for the other one light.

Although exemplary embodiments of the invention have been described in detail, it will be understood by those skilled in the art that various changes may be made without departing from the spirit or scope of the invention. Therefore, the scope of the present invention is to be determined by the following claims and their equivalents and is not restricted or limited by the foregoing detailed description.

The invention claimed is:

1. A pulse width modulation (PWM) signal generator comprising:
   a first comparison unit configured to compare an input duty value to an input reference wave and output a first PWM signal;
   a signal inversion unit configured to invert the input duty value on the basis of a maximum value of the reference wave;
   a second comparison unit configured to compare the duty value inverted by the signal inversion unit to the input reference wave and output a second PWM signal; and
   a reference wave generator configured to generate the reference wave and transfer the reference wave to the first comparison unit and the second comparison unit,
   wherein the signal inversion unit subtracts the input duty value from the maximum value of the reference wave in order to invert the input duty value.

2. The PWM signal generator of claim 1, wherein the reference wave is a sawtooth wave or a triangle wave; and
   the first comparison unit outputs a high signal while the reference wave has a value less than or equal to the input duty value and outputs a low signal while the reference wave has a value exceeding the input duty value, thereby generating the first PWM signal.

3. The PWM signal generator of claim 1, wherein the reference wave is a sawtooth wave or a triangle wave; and
   the second comparison unit outputs a low signal while the reference wave has a value less than or equal to the inverted duty value and outputs a high signal while the reference wave has a value exceeding the inverted duty value, thereby generating the second PWM signal.

4. A pulse width modulation (PWM) signal generator comprising:
   a first comparison unit configured to compare an input first duty value to an input reference wave and output a first PWM signal;
   a signal inversion unit configured to invert a second duty value different from the first duty value on the basis of a maximum value of the reference wave;
   a second comparison unit configured to compare the second duty value inverted by the signal inversion unit to the input reference wave and output a second PWM signal; and
   a reference wave generator configured to generate the reference wave and transfer the reference wave to the first comparison unit and the second comparison unit,
   wherein the signal inversion unit subtracts the second duty value from the maximum value of the reference wave in order to invert the second duty value.

5. The PWM signal generator of claim 4, wherein the reference wave is a sawtooth wave or a triangle wave; and
   the first comparison unit outputs a high signal while the reference wave has a value less than or equal to the input first duty value and outputs a low signal while the reference wave has a value exceeding the input first duty value, thereby generating the first PWM signal.

6. The PWM signal generator of claim 4, wherein the reference wave is a sawtooth wave or a triangle wave; and
   the second comparison unit outputs a low signal while the reference wave has a value less than or equal to the inverted second duty value and outputs a high signal while the reference wave has a value exceeding the inverted second duty value, thereby generating the second PWM signal.

7. A lighting control apparatus comprising:
   a power supply unit configured to supply power;
   a pulse width modulation (PWM) signal generator in claim 1;
   a first light driving unit configured to supply the power of the power supply unit to a first light according to a first PWM signal generated by the PWM signal generator; and
   a second light driving unit configured to supply the power of the power supply unit to a second light according to a second PWM signal generated by the PWM signal generator.

8. A lighting control apparatus comprising:
   a power supply unit configured to supply power;
   a pulse width modulation (PWM) signal generator in claim 4;
   a first light driving unit configured to supply the power of the power supply unit to a first light according to a first PWM signal generated by the PWM signal generator; and
   a second light driving unit configured to supply the power of the power supply unit to a second light according to a second PWM signal generated by the PWM signal generator.

* * * * *